(12) United States Patent
Duffy et al.

(10) Patent No.: US 10,198,391 B2
(45) Date of Patent: Feb. 5, 2019

(54) INTEGRATED INPUT/OUTPUT CONNECTOR

(71) Applicant: Hamilton Sundstrand Corporation, Charlotte, NC (US)

(72) Inventors: Jason C. Duffy, Granby, CT (US); Kenneth J. Trotman, Granby, CT (US)

(73) Assignee: Hamilton Sunstrand Corporation, Charlotte, NC (US)

( * ) Notice: Subject to any disclaimer, the term of this patent is extended or adjusted under 35 U.S.C. 154(b) by 412 days.

(21) Appl. No.: 14/831,169

(22) Filed: Aug. 20, 2015

(65) Prior Publication Data
US 2017/0052921 A1   Feb. 23, 2017

(51) Int. Cl.
| | |
|---|---|
| *H01R 13/00* | (2006.01) |
| *G06F 13/40* | (2006.01) |
| *H01R 12/73* | (2011.01) |
| *H01R 13/52* | (2006.01) |
| *H01R 13/66* | (2006.01) |
| *H01R 31/06* | (2006.01) |
| *H03M 1/00* | (2006.01) |
| *H01R 13/622* | (2006.01) |

(52) U.S. Cl.
CPC ......... *G06F 13/4081* (2013.01); *H01R 12/73* (2013.01); *H01R 13/5202* (2013.01); *H01R 13/6658* (2013.01); *H01R 13/6675* (2013.01); *H01R 31/065* (2013.01); *H03M 1/00* (2013.01); *H01R 13/622* (2013.01); *H01R 2201/26* (2013.01)

(58) Field of Classification Search
CPC .......................... H01R 13/622; H01R 13/5202
See application file for complete search history.

(56) References Cited

U.S. PATENT DOCUMENTS

| | | | |
|---|---|---|---|
| 8,047,873 B1 | 11/2011 | Wang | |
| 2004/0015630 A1* | 1/2004 | Boolos | H04L 12/40045 710/300 |
| 2006/0189206 A1 | 8/2006 | Huang et al. | |
| 2006/0210053 A1 | 9/2006 | Chang | |
| 2007/0082509 A1 | 4/2007 | Kuo | |
| 2007/0259568 A1* | 11/2007 | Mackillop | H01R 13/6463 439/638 |
| 2013/0309879 A1 | 11/2013 | Chang | |
| 2015/0017836 A1 | 1/2015 | Wu et al. | |

FOREIGN PATENT DOCUMENTS

| | | |
|---|---|---|
| CN | 203645651 | 6/2014 |
| EP | 1 383 280 A1 | 1/2004 |

OTHER PUBLICATIONS

Extended European Search Report for European Patent Application No. 16184699.3, dated Jan. 17, 2017.
Communication pursuant to Article 94(3) EPC received in counterpart European Patent Application No. 16 184 699.3-1201 dated Jun. 5, 2018.

* cited by examiner

*Primary Examiner* — Zachary K Huson
(74) *Attorney, Agent, or Firm* — Locke Lord LLP; Joshua L. Jones; Georgi Korobanov

(57) ABSTRACT

An active input/output connector includes a first printed circuit board and a second printed circuit board enclosed within a housing. A first plug is in electronic communication with the first printed circuit board. A second plug is in electronic communication with the second printed circuit board. The first and second printed circuit boards are connected for communication of sensor signals from the first plug to the second plug.

10 Claims, 1 Drawing Sheet

INTEGRATED INPUT/OUTPUT CONNECTOR

GOVERNMENT RIGHTS STATEMENT

This invention was made with government support under contract number FA8650-09-D-2923 awarded by the United States Air Force. The government has certain rights in the invention.

BACKGROUND OF THE INVENTION

1. Field of the Invention

This present disclosure relates to electronic systems and, more particularly, to apparatuses for providing input/output connectors capable of use with a plurality of physical connector arrangements.

2. Description of Related Art

Many modern vehicle applications utilize electronic sensors and controllers in their standard operations. In a typical vehicle, many of the components will require data from sensors or other components to perform their designated function. To facilitate the data transfer between components, most vehicles use a bundle of wires and interconnects, referred to as an electrical harness. The harness can contain thousands of data lines, typically constructed of copper wires, and can be heavy. In such a construction each data line has an interconnect on each end. The interconnects can be plugged into the vehicle components, and data can then be communicated through the harness to a component connected at the opposite end of the data line.

Current state of the art electrical harnesses utilize analog data transmission, requiring dedicated wires in the harness for each component. Analog signals are used because most sensors and other components require analog data or take analog measurements.

In order to reduce the weight of the harness, attempts have been made to utilize digital communications between the components. These attempts have typically been met with failure at least in part because many of the sensors and other components in existing systems have not been modified to allow for digital communications.

Thus, there is a need in the art for improved devices for input/output connections. The present disclosure provides a solution for this need.

SUMMARY OF THE INVENTION

A active input/output connector includes a first printed circuit board and a second printed circuit board enclosed within a housing. A first plug is in electronic communication with the first printed circuit board. A second plug is in electronic communication with the second printed circuit board. The first and second printed circuit boards are connected for communication of sensor signals from the first plug to the second plug.

A collar can be threadably engaged to the housing with a watertight sealant around a threaded interface of the collar. The collar can engage the housing to create a watertight seal around components within the housing. The collar can include a plurality of anti-rotation legs. Each of the first and second printed circuit boards can include a plurality of indentations for slidably accepting a respective anti-rotation leg therein. The anti-rotation legs positioned between the second plug and the housing prevent rotation of the second plug. The collar can include an O-ring positioned between the second plug and the housing to provide an environmental seal with the second plug.

The first circuit board can include a power supply and processor. The second circuit board can be an analog circuit board. The first printed circuit board can be configured to convert sensor signals to standard digital format for a central computer. The first circuit board can include at least one board to board connectors and the second circuit board includes at least one opening for accepting a respective board to board connector therein. It is also contemplated that, the first and second circuit boards will be mated together.

The first plug can be configured and adapted to connect directly to aircraft avionics sensors and to receive an interconnect harness.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
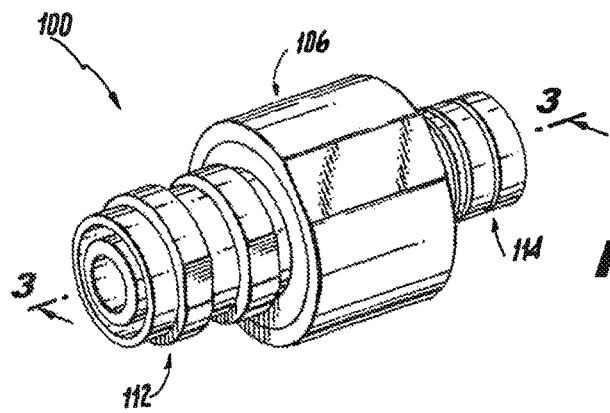
FIG. 1 is a perspective view of an exemplary embodiment of active input/output connector constructed in accordance with the present disclosure.

Reference will now be made to the drawings wherein like reference numerals identify similar structural features or aspects of the subject disclosure. For purposes of explanation and illustration, and not limitation, a partial view of an exemplary embodiment of an input/output (IO) connector in accordance with the disclosure is shown in FIG. 1 and is designated generally by reference character 100. Other embodiments of the connector in accordance with the disclosure, or aspects thereof, are provided in FIGS. 2-3, as will be described.

Figure 2:
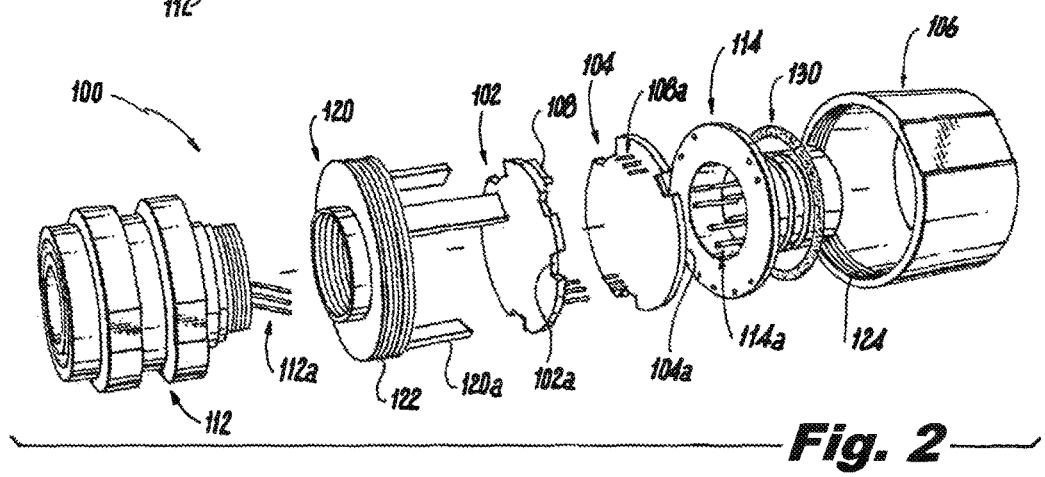
FIG. 2 is an exploded perspective view of the connector of FIG. 1, showing components of the connector configured to communicate sensor signals.

FIG. 1 illustrates the IO connector 100 of the present disclosure. The connector 100 includes a housing 106 for storing components of the connector 100 between a first plug 112 and a second plug 114. With reference to FIG. 2 an exploded view of the IO connector 100 is shown. The connector 100 is configured and adapted to interface with various sensors, for example sensors onboard an aircraft. The connector 100 allows for interfacing with the existing sensors on the aircraft without additional cost to the sensor or the central processing computer and allows for reduction in wiring harness weight. The connector 100 includes a first printed circuit board 102 and a second printed circuit board 104 enclosed within the housing 106. The first printed circuit board 102 includes a power supply, processor and communication means. The second printed circuit 104 is an analog board. The first printed circuit 104 includes at least two board-to-board connections 108 extending outwardly towards the second printed circuit board 104. The second printed circuit boards include at least one opening 108a for accepting a respective board-to-board connector therein. In addition to or in lieu of board-to-board connections 108, the first and second printed circuit boards 102,104 can be mated together.

The first plug 112 is in electrical communication through leads 112a with the first printed circuit board 102 and the second plug 114 is similarly in electrical communication 114a with the second printed circuit board 104. The first and second plugs 112, 114 can be standard connections, for example the first plug can be a shell size 13 plug and the second plug can be a shell size 13 receptacle. The first and second printed circuit boards 102, 104 are connected to communicate sensor signals between the first and second plugs 112, 114. For example, the first printed circuit board 102 is configured to convert sensor signals received from the second circuit board 104 to a standard digital format to transmit sensor data through the first plug 112. It is envisioned that current systems can be retrofitted with the active connector 100 of the present disclosure. For example, referring to the state of the art in aircraft, the current aircraft harness systems can be disconnected from the sensors and the connector can be attached to the sensor. A new harness using lighter and less wiring can be added to the connector to communicate the digital signals outputted from the connector without having to replace the existing sensors or central avionics.

Figure 3:
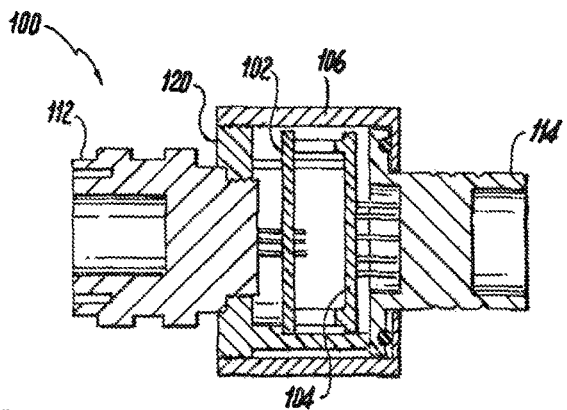
FIG. 3 is a cross-sectional side elevation view of the assembled connector of FIG. 1 taken along line 3-3.

With reference to FIGS. 2 and 3, a collar 120 is positioned between the first printed circuit board 102 and the first plug 112 and threadably engages the housing. The collar has a watertight sealant around a threaded surface 122 which engages threads 124 of the housing 106 to create a watertight seal around the components within the housing 106. The collar 120 further provides an anti-rotation feature to the connector. The collar includes a plurality of anti-rotation legs 120a. Each of the first and second printed circuit boards 102, 104 includes a plurality of indentations 102a, 104a, respectively, along respective outer edges for slidably accepting a respective anti-rotation leg 120a therein. An O-ring 130 is also included within connector 100 to further provide an environmental seal. The O-ring 130 is disposed between the second plug 114 and the housing 106 to provide an environmental seal with the second plug 114.

The systems of the present disclosure, as described above and shown in the drawings, provide for an active IO connector with superior properties including digital to analog conversion while being accessible for current and future systems. While the apparatus and methods of the subject disclosure have been shown and described with reference to preferred embodiments, those skilled in the art will readily appreciate that change and/or modification may be made thereto without departing from the scope of the subject disclosure.

What is claimed is:

1. An active input/output connector, comprising:
a first printed circuit board and a second printed circuit board enclosed within a housing;
a first plug in electronic communication with the first printed circuit board; and
a second plug in electronic communication with the second printed circuit board,
wherein the first and second printed circuit boards are connected for communication of sensor signals from the first plug to the second plug,
wherein the first circuit board includes a power supply and processor,
wherein the first printed circuit board is configured to convert sensor signals to standard digital format for a central computer, and
wherein the second circuit board is an analog circuit board to allow digital devices to communicate using analog data transmission over an electrical harness.

2. The connector of claim 1, further comprising a collar threadably engaged to the housing having a watertight sealant around a threaded interface of the collar which engages the housing to create a watertight seal around components within the housing.

3. The connector of claim 2, wherein the collar includes a plurality of anti-rotation legs for engaging the first and second printed circuit boards.

4. The connector of claim 3, wherein each of the first and second printed circuit boards includes a plurality of indentations for slidably accepting a respective anti-rotation leg therein.

5. The connector of claim 1, further comprising an O-ring positioned between the second plug and the housing to provide an environmental seal with the second plug.

6. The connector of claim 1, wherein the first circuit board includes at least two board to board connectors and the second circuit board includes at least one opening for accepting a respective board to board connector therein.

7. The connector of claim 1, wherein the first and second circuit boards are mated together.

8. The connector as in any of the preceding claims, wherein the first plug is configured and adapted to connect directly to aircraft avionics sensors and the second plug is configured and adapted to receive a wiring harness.

9. An active input/output connector, comprising:
a housing;
a collar threadably engaging the housing configured to prevent rotation and seal components within the housing;
a first printed circuit board and a second printed circuit board enclosed within the housing;
a first plug threaded to the collar in electronic communication with the first printed circuit board; and
a second plug enclosed within the housing in electronic communication with the second printed circuit board,
wherein the first and second printed circuit boards are connected for communication of sensor signals from the first plug to the second plug,
a collar threadably engaged to the housing having a watertight sealant around a threaded interface of the collar which engages the housing to create a watertight seal around components within the housing,
wherein the collar includes three of anti-rotation legs for engaging the first and second printed circuit boards about respective outer edges of the first and second printed circuit boards,
wherein each of the first and second printed circuit boards includes three indentations for slidably accepting a respective anti-rotation leg therein.

10. An active input/output connector, comprising:
a first printed circuit board and a second printed circuit board enclosed within a housing;
a first plug in electronic communication with the first printed circuit board;
a second plug in electronic communication with the second printed circuit board,
wherein the first and second printed circuit boards are connected for communication of sensor signals from the first plug to the second plug wherein the first circuit board includes a power supply and processor, wherein the first printed circuit board is configured to convert sensor signals to standard digital format for a central computer, and wherein the second circuit board is an analog circuit board to allow digital devices to communicate using analog data transmission over an electrical harness; and a collar threadably engaged to the housing having a watertight sealant around a threaded interface of the collar which engages the housing to create a watertight seal around components within the housing, wherein the collar includes three of anti-rotation legs for engaging the first and second printed circuit boards about respective outer edges of the first and second printed circuit boards, wherein each of the first and second printed circuit boards includes three indentations for slidably accepting a respective anti-rotation leg therein.

* * * * *